United States Patent
Yu et al.

(10) Patent No.: US 7,929,346 B2
(45) Date of Patent: Apr. 19, 2011

(54) MEMORY DATA DETECTING APPARATUS AND METHOD FOR CONTROLLING REFERENCE VOLTAGE BASED ON ERROR IN STORED DATA

(75) Inventors: Dong Hun Yu, Seoul (KR); Kyoung Lae Cho, Yongin-si (KR); Dong Hyuk Chae, Seoul (KR); Jun Jin Kong, Yongin-si (KR); Jae Hong Kim, Seoul (KR); Seung-Hwan Song, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 280 days.

(21) Appl. No.: 12/216,745

(22) Filed: Jul. 10, 2008

(65) Prior Publication Data

US 2009/0207671 A1    Aug. 20, 2009

(30) Foreign Application Priority Data

Feb. 15, 2008  (KR) .................. 10-2008-0014090

(51) Int. Cl.
*G11C 16/06* (2006.01)
*G11C 16/34* (2006.01)
*G11C 16/26* (2006.01)

(52) U.S. Cl. ......... 365/185.09; 365/185.02; 365/185.22; 365/185.03; 365/185.21; 365/185.2; 365/200

(58) Field of Classification Search ............. 365/185.02, 365/185.09, 185.03, 185.21, 185.22, 185.2, 365/200

See application file for complete search history.

(56) References Cited

U.S. PATENT DOCUMENTS

| 5,453,998 | A  * | 9/1995 | Dang ............................ 714/805 |
| 5,532,962 | A  * | 7/1996 | Auclair et al. ................ 365/201 |
| 2006/0215450 | A1 | 9/2006 | Honma et al. |
| 2007/0086239 | A1 | 4/2007 | Litsyn et al. |
| 2007/0091677 | A1* | 4/2007 | Lasser et al. ............. 365/185.09 |
| 2007/0133277 | A1 | 6/2007 | Kawai et al. |

FOREIGN PATENT DOCUMENTS

| EP | 1 239 490 | 9/2002 |
| KR | 10-2004-0006416 | 1/2004 |
| KR | 10-2005-0011409 | 1/2005 |
| KR | 10-2006-0040064 | 5/2006 |

OTHER PUBLICATIONS

International Search Report dated Aug. 25, 2008.

* cited by examiner

*Primary Examiner* — J. H. Hur
(74) *Attorney, Agent, or Firm* — Harness, Dickey & Pierce, P.L.C.

(57) ABSTRACT

Example embodiments may relate to a method and an apparatus for reading data stored in a memory, for example, providing a method and an apparatus for controlling a reference voltage based on an error of the stored data. Example embodiments may provide a memory data detecting apparatus including a first voltage comparator to compare a threshold voltage of a memory cell with a first reference voltage, a first data determiner to determine a value of at least one data bit stored in the memory cell according to a result of the comparison, an error verifier to verify whether an error occurs in the determined value, a reference voltage determiner to determine a second reference voltage that is lower than the first reference voltage based on a result of the verification, and a second data determiner to re-determine the value of the data based on the determined second reference voltage.

15 Claims, 9 Drawing Sheets

MEMORY DATA DETECTING APPARATUS AND METHOD FOR CONTROLLING REFERENCE VOLTAGE BASED ON ERROR IN STORED DATA

PRIORITY STATEMENT

This application claims the benefit of a Korean Patent Application No. 2008-14090, filed on Feb. 15, 2008 in the Korean Intellectual Property Office, the disclosure of which is incorporated herein by reference.

BACKGROUND

1. Field

Example embodiments relate to a method and an apparatus for reading data stored in a memory. For example, example embodiments may relate to a method and an apparatus for controlling a reference voltage based on whether an error occurs in the stored data.

2. Description of Related Art

A single-level cell (SLC) memory device may store one data bit in a single memory cell. The SLC memory may be referred to as a single-bit cell (SBC) memory. The SLC memory may store and read one data bit at a voltage level included in two distributions that are divided by a threshold voltage level programmed in a memory cell. The programmed threshold voltage may have a distribution within a certain range due to a fine electric characteristic difference between the SLC memories. For example, when a voltage level read from the memory cell is greater than 0.5V and less than 1.5V, it may be determined that the data stored in the memory cell has a logic value of "1." When the voltage level read from the memory cell is greater than 2.5V and less than 3.5V, it may be determined that the data stored in the memory cell has a logic value of "0." The data stored in the memory cell may be classified depending on the difference between cell currents and/or cell voltages during the reading operations.

Meanwhile, a multi-level cell (MLC) memory device that may store two or more data bits in a single memory cell has been proposed in response to a need for higher integration of memory. The MLC memory device may also be referred to as a multi-bit cell (MBC) memory. However, as the number of bits stored in the single memory cell increases, reliability may deteriorate and read-failure rates may increase. To store "m" bits in a single memory cell, $2^m$ voltage level distributions may be required. However, since the voltage window for a memory device is limited, the difference in threshold voltage between adjacent bits may decrease as "m" increases, causing the read-failure rate to increase.

Accordingly, conventional art may not be able to improve storage density using a MLC memory due to the above-mentioned reasons.

SUMMARY

Example embodiments may provide a memory data detecting method to control a reference voltage based on the data error that may occur due to a changed threshold voltage, when the threshold voltage of a memory cell is changed.

Example embodiments also may provide a memory data detecting apparatus to control a reference voltage based on the data error that may occur due to a changed threshold voltage, when the threshold voltage of a memory cell is changed.

According to example embodiments, a method for detecting memory data may include comparing a threshold voltage of a memory cell with a first reference voltage, determining a value of at least one data bit stored in the memory cell according to the comparing; verifying whether an error occurs in the at least one data bit based on the determining a value, determining a second reference voltage that is lower than the first reference voltage based on the verifying, and re-determining the value of the at least one data bit based on the determining the second reference voltage.

According to example embodiments, a memory data detecting apparatus may include a first voltage comparator to compare a threshold voltage of a memory cell with a first reference voltage, a first data determiner to determine a value of at least one data bit stored in the memory cell according to a result of the comparison, an error verifier to verify whether an error occurs in the determined value, a reference voltage determiner to determine a second reference voltage that is lower than the first reference voltage based on a result of the verification, and a second data determiner to re-determine the value of the data based on the determined second reference voltage.

According to the disclosed example embodiments, when a threshold voltage of a memory cell is changed, a reference voltage may be controlled based on a data error that may occur due to the changed threshold voltage. Upon re-detecting data value stored in the memory cell based on the changed reference voltage, data without an error may be detected.

BRIEF DESCRIPTION

The above and other features and advantages will become more apparent by describing in detail example embodiments thereof with reference to the attached drawings in which.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Reference will now be made in detail to the example embodiments, in the accompanying drawings, wherein like reference numerals refer to the like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 1:
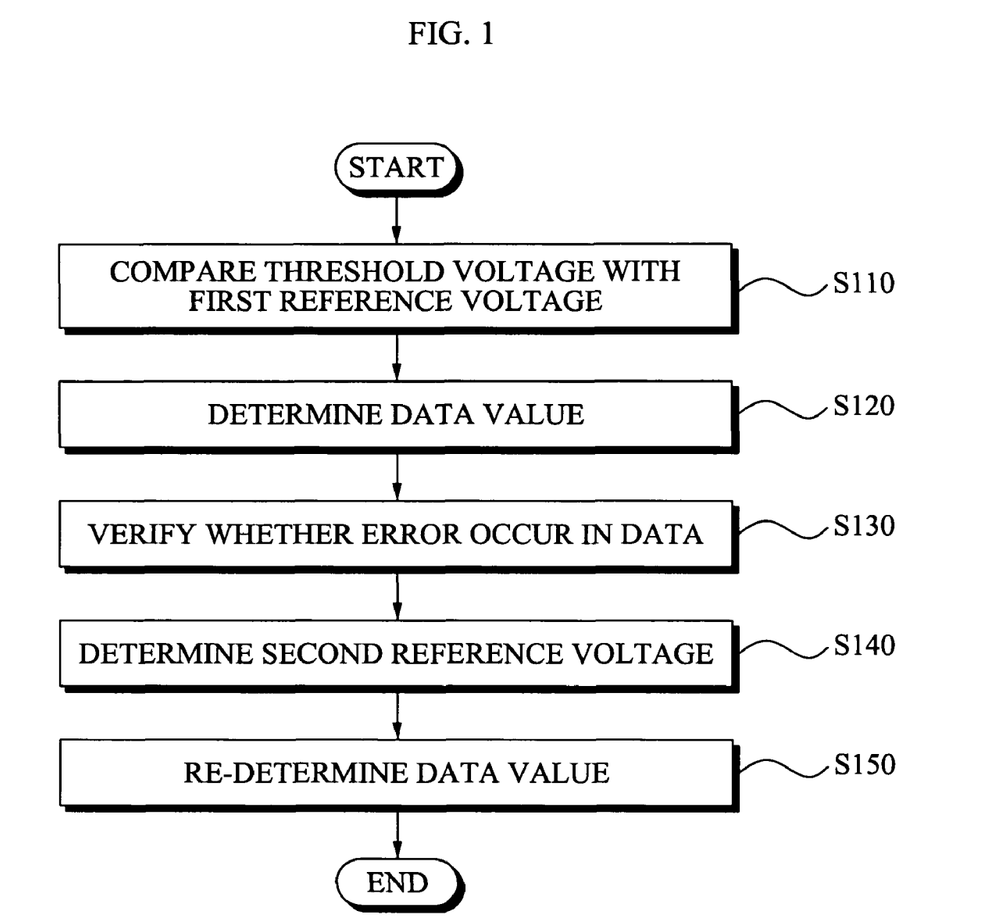
FIG. 1 is a flowchart illustrating a memory data detecting method according to example embodiments.

FIG. 1 is a flowchart illustrating a memory data detecting method according to example embodiments. Referring to FIG. 1, a memory data detecting method according to example embodiments is described in detail below.

In operation S110, a threshold voltage of a memory cell may be compared with a first reference voltage. The threshold voltage may be determined based on an amount of an electric charge stored in the memory cell. The amount of the electric charge may be determined based on the memory cell. According to example of embodiments, the threshold voltage of the memory cell may be compared with at least one reference voltage in operation S110.

In operation S120, a value of at least one data bit stored in the memory cell may be determined according to the comparison result in operation S110. According to example embodiments, when one-bit data is stored in the memory cell, the threshold voltage of the memory cell may be compared with a single first reference voltage. According to example embodiments, when the threshold voltage is greater than the first reference voltage, it may be determined that the value "0" is stored in the memory cell. When the threshold voltage is less than the first reference voltage, it may be determined that the value "1" is stored in the memory.

According to example embodiments, at least one data bit may be stored in the memory cell. According to example embodiments, when two-bit is stored in the memory cell, the threshold voltage of the memory cell may be compared with three first reference voltages. A range of a value that the threshold voltage of the memory cell may have may be divided into four regions by the three first reference voltages.

In general, when N-bits are stored in the memory cell, where N is an integer, a range of the threshold voltage of the memory cell may be divided into $2^N$ regions by $2^N-1$ first reference voltages. The memory data detecting apparatus may determine value of N-bit data based on an ordinal number of a region where the threshold voltage of the memory cell is located in the $2^N$ regions.

According to example embodiments, the threshold voltage of the memory cell may be compared with the three first reference voltages and verified in operation S110. In operation S120, a region among four regions the threshold voltage of the memory cell may be located in is identified based on the comparison result. Based on the verified result, the value of two-bit data may be determined.

Operation S130 may verify whether an error occurs in the determined data of operation S120. According to example embodiments, whether an error occurs in the determined data using a predetermined error correction encoding method may be verified in operation S130. Also, according to example embodiments, whether an error occurs in the determined data using either a block code or a convolutional code may be verified in operation S130.

According to example embodiments, at least one bit stored in the same memory cell may be error correcting coded and the memory detecting apparatus may verify whether an error occurs in the at least one bit stored in the same memory cell.

According to example embodiments, at least one bit stored in the same location of a different memory cell may be error-correction encoded and a memory detecting apparatus may verify whether an error occurs in the at least one bit stored in the same location of the different memory cell. For example, a first bit data of a first memory cell and a first bit data of a second memory cell may be error-correction encoded together.

In operation S140, the first reference voltage that is lower than the second reference voltage may be determined based on whether an error occurs in data stored in the memory cell. The threshold voltage of the memory cell may change over time.

A reason that the threshold voltage of the memory cell may have changed may be High Temperature Stress (HTS).

The data stored in the memory cell may be determined by the threshold voltage of the memory cell. The threshold voltage of the memory cell may relate to an amount of an electric charge stored in the memory cell. After the data is stored in the memory cell, the amount of the electric charge stored in the memory cell may be changed due to thermal energy. The threshold voltage of the memory cell may also change over time after the data is stored in the memory cell. When the threshold voltage of the memory cell is changed, a value of the data stored in the memory cell may be detected as a value different from the value of when the data is stored in the memory cell. Thus, an error may occur in the data stored in the memory cell.

The electric charge stored in the memory cell may be distributed by HTS. In conclusion, generally the threshold voltage of the memory cell may become lower than a threshold voltage of when the data is stored in the memory cell. Thus, the threshold voltage may be changed toward a lower threshold voltage.

The value of the data stored in the memory cell may be determined based on a region in which the threshold voltage of the memory cell is located. When an error occurs in the data stored in the memory cell, generally, a threshold voltage that is initially stored in the memory cell may be higher than a threshold voltage at the time of detecting an error.

Thus, in operation S140, the second reference voltage that is lower than the first reference voltage may be determined, wherein the first reference voltage may be a reference voltage of when the data is initially stored in the memory cell.

In operation S150, the value of data stored in the memory cell may be re-determined based on the second reference voltage determined in operation S140. When the threshold voltage of the memory cell is changed by HTS and the like, an error may occur in the data stored in the memory cell. In operation S140, the second reference voltage may be determined based on the error in the data, and in operation S150, the value of the data stored in the memory cell may be determined based on the determined second reference voltage. According to example embodiments, when an error occurs in the data stored in the memory cell, a value of data may be accurately detected.

A range of values that the threshold voltage of the memory cell may have may be divided into a plurality of regions by a plurality of the second reference voltages. The memory data detecting apparatus may compare the threshold voltage of the memory cell with the plurality of the second reference voltages, identify a region among the plurality of the regions the threshold voltage of the memory cell is located in, and determine a value of the data stored in the memory cell according to the verified result.

Accordingly, determining of the second reference voltage may determine a region in which the threshold voltage of the memory cell is located. According to example embodiments, either the region where the threshold voltage is located or the second reference voltage is re-determined, based on whether an error occurs in the data stored in the memory cell, may be used to thereby detect an accurate value of the data stored in the memory cell.

Figure 2A:
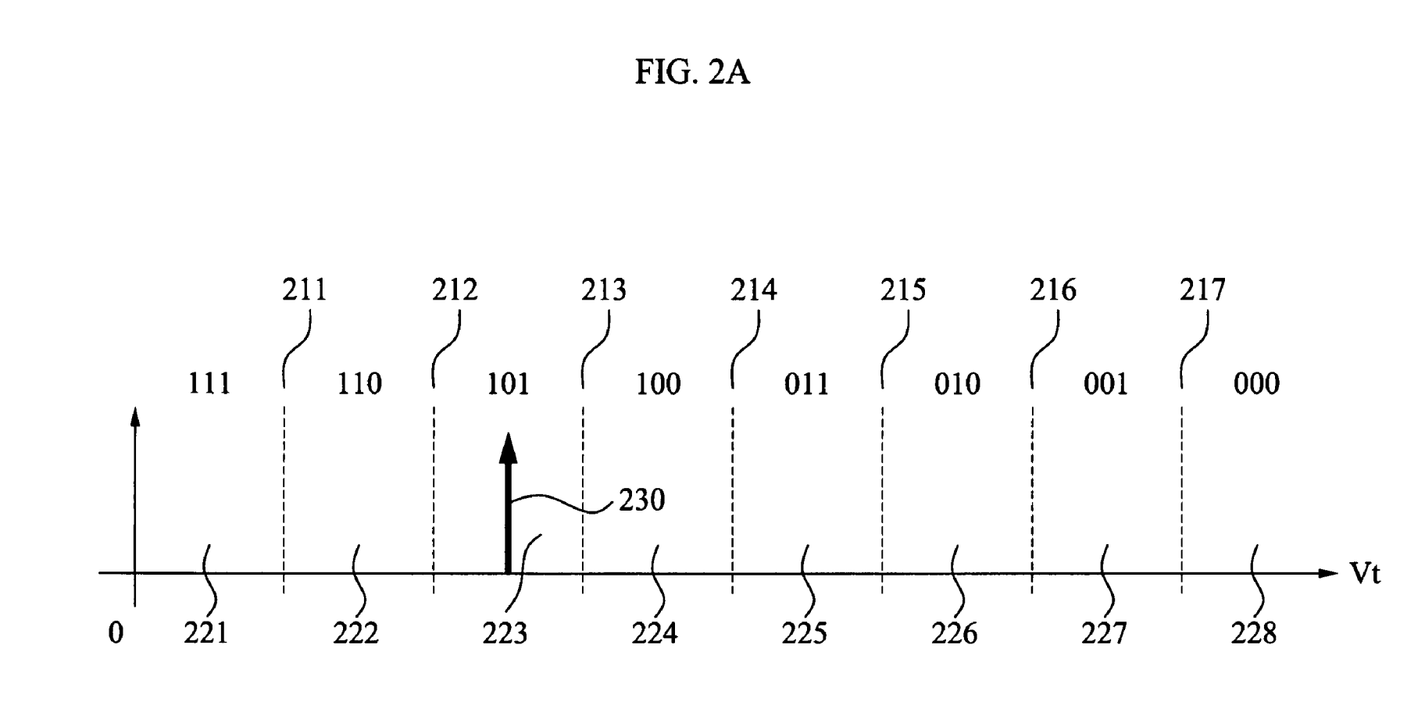
FIGS. 2A through 2C illustrate a method of controlling a reference voltage and eliminating an error, according to example embodiments, when the error occurs in a lower bit of two-bit data from a plurality of data bits stored in a memory cell.
Figure 2B:
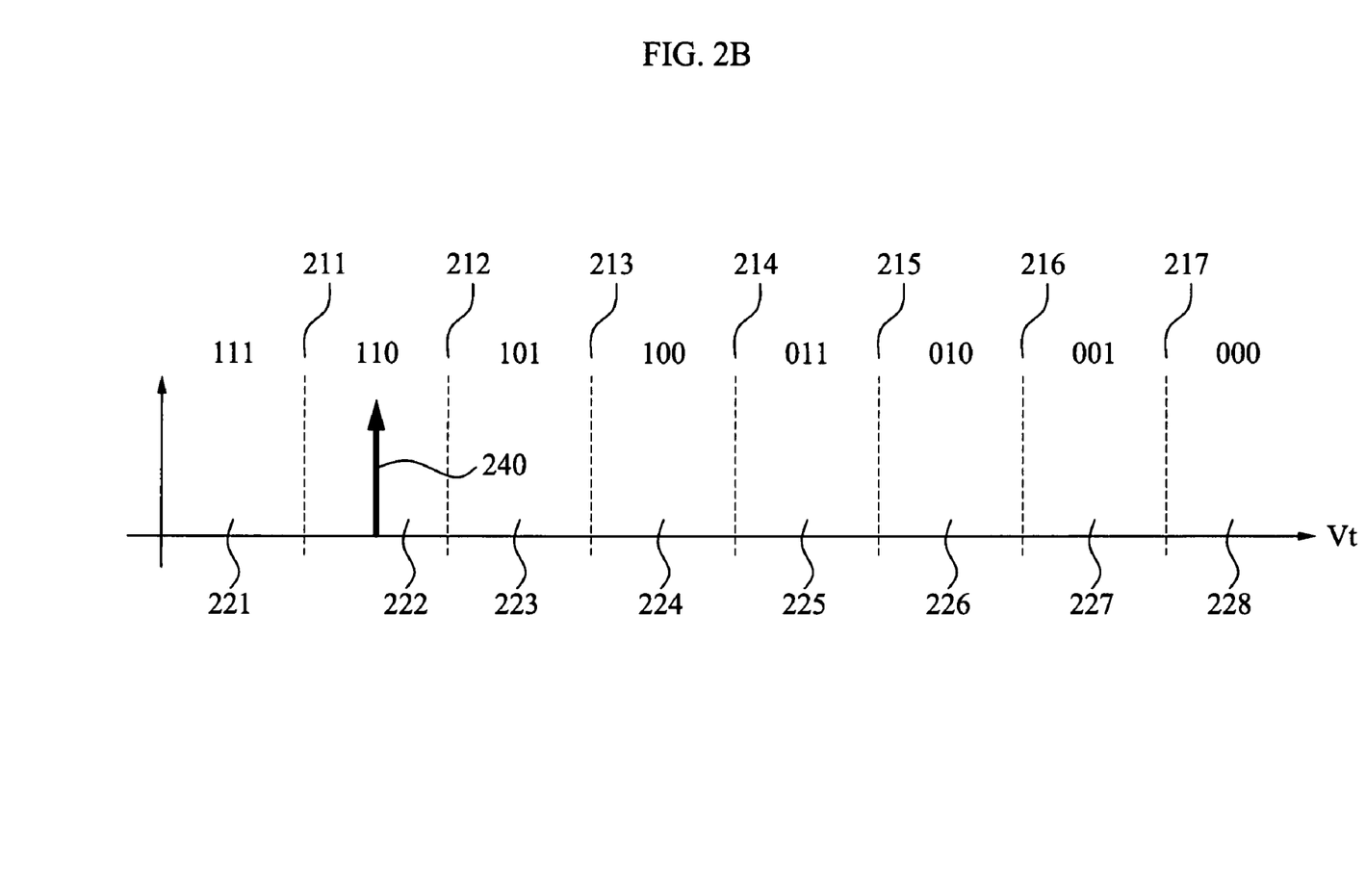
Figure 2C:
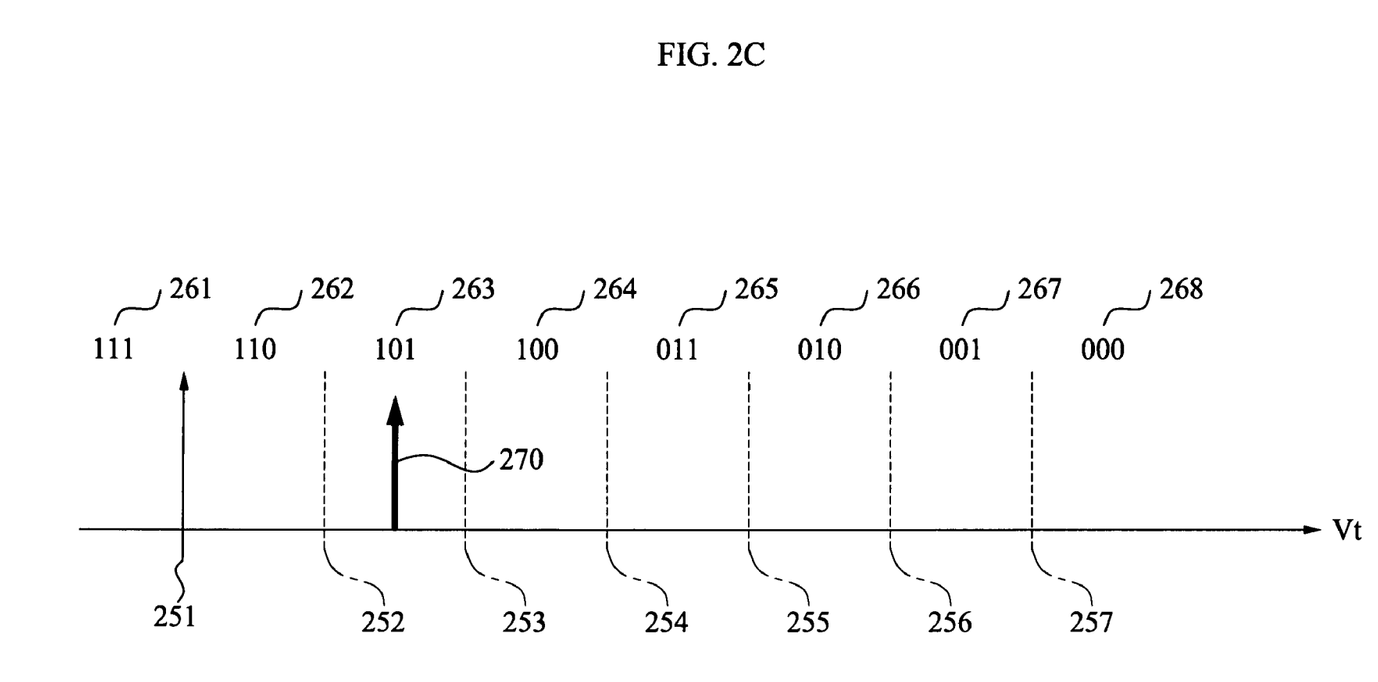

FIGS. 2A through 2C illustrate a method of controlling a reference voltage and eliminating an error, according to example embodiments, when the error occurs in a lower bit of two-bit data from a plurality of data bits stored in a memory cell.

FIG. 2A illustrates a storing state of the at least one data bit in the memory cell. A range of values that the threshold voltage may have may be divided into a plurality of regions 221, 222, 223, 224, 225, 226, 227, and 228 by first reference voltages 211, 212, 213, 214, 215, 216, and 217. A value of the data stored in the memory cell may be determined based on which region the threshold voltage of the memory cell is located in. According to example embodiments of FIG. 2A, data having a value "101," may be stored in a memory cell. The threshold voltage of the memory cell for storing the data "101," may be located in a third region 223 among the plurality of regions 221, 222, 223, 224, 225, 226, 227, and 228.

FIG. 2B illustrates that the threshold voltage of the memory cell may change due to HTS, and the like. The example embodiment of FIG. 2B may show that a threshold voltage 240 of the memory cell is moved to a second region 222 from the third region 223 among the plurality of the regions divided by the first reference voltages 211, 212, 213, 214, 215, 216, and 217. A memory detecting apparatus may compare the threshold voltage of the memory cell with the first reference voltages 211, 212, 213, 214, 215, 216, and 217 and identify that the threshold voltage is located in the second region 222.

When the threshold voltage of the memory cell is located in the second region 222, the memory data detecting apparatus may verify a value of the stored data in the memory cell as "110."

The memory detecting apparatus may verify whether an error occurs in the detected data "110." Because an initial value of the data stored in the memory cell is "101," not "110," the memory detecting apparatus may identify that an error occurs in the stored data. According to example embodiments, the memory detecting apparatus may identify that an error occurs in the stored data and identify the at least one error-bit having an error among the at least one data bit.

According to example embodiments, the memory data detecting apparatus may identify a location of an error-bit among the at least one data bit and determine a second reference voltage according to the identified location of the error-bit.

FIG. 2C illustrates the second reference voltages 251, 252, 253, 254, 255, 256, and 257 determined based on an error occurring in data, and the plurality of regions 261, 262, 263, 264, 265, 266, 267, and 268 divided by the second reference voltages 251, 252, 253, 254, 255, 256, and 257.

Because an error may occur in the lowest bit, in the current example, a "1," in the stored data "101," the second reference voltage may be determined to make the lowest bit have the value "1." When the lowest bit has the value "1," it may be verified that the threshold voltage of the memory cell has been located in one of a first region 261, a third region 263, a fifth region 265 or a seventh region 267 among the plurality of regions 261, 262, 263, 264, 265, 266, 267, and 268 divided by the second reference voltages. Referring to FIGS. 2A and 2B, as the threshold voltage may become lower due to the HTS, the memory detecting apparatus verifies that the threshold voltage 230, from when the data was stored, is higher than the threshold voltage 240, from when the data was detected. The memory data detecting apparatus may verify that the threshold voltage 230 from when the data was stored may have been located in one of the third region 223, the fifth region 225, or seventh region 227 of FIG. 2B.

According to example embodiments, the memory data detecting apparatus may determine the second reference voltage to reduce a difference between the first and the second reference voltage. In example embodiments of FIG. 2B, because the detected threshold voltage 240 is located in the second region 222, when a difference between the first reference voltages 211, 212, 213, 214, 215, 216, and 217 and second reference voltages 251, 252, 253, 254, 255, 256, and 257, as shown in FIG. 2C, is determined to be reduced, a threshold voltage 270 of the memory cell may be located in the third region 263 among the plurality of regions 261, 262, 263, 264, 265, 266, and 267 divided by the second reference voltages 251, 252, 253, 254, 255, 256, and 257.

The memory data detecting apparatus may re-determine a value of data stored in the memory cell based on the second reference voltage. The memory data detecting apparatus may compare a threshold voltage 270 of the memory cell with the second reference voltages 251, 252, 253, 254, 255, 256, and 257 and verify that the threshold voltage is located in the third region 263 among the plurality of regions 261, 262, 263, 264, 265, 266, 267, and 268 divided by the second reference voltages 251, 252, 253, 254, 255, 256, and 257. The memory data detecting apparatus may verify that the value "101" is stored in the data of the memory cell.

Comparing the threshold voltage 270 in FIG. 2C with the threshold voltage 240 of FIG. 2B, threshold voltages 270 and 280 may have the same voltage, but a reference voltage to determine data may be changed from the first reference voltage to the second reference voltage. Thus, when the memory data detecting apparatus re-determines the value of the data stored in the memory cell, a value of the data "101," may be accurately detected.

According to example embodiments, the memory data detecting apparatus may verify whether an error occurs in a second bit of the re-determined data. In example embodiment of FIGS. 2A through 2C, although an error occurs in the second bit, the error in the second bit may also be corrected when an error in the least significant bit is corrected.

Figure 3A:
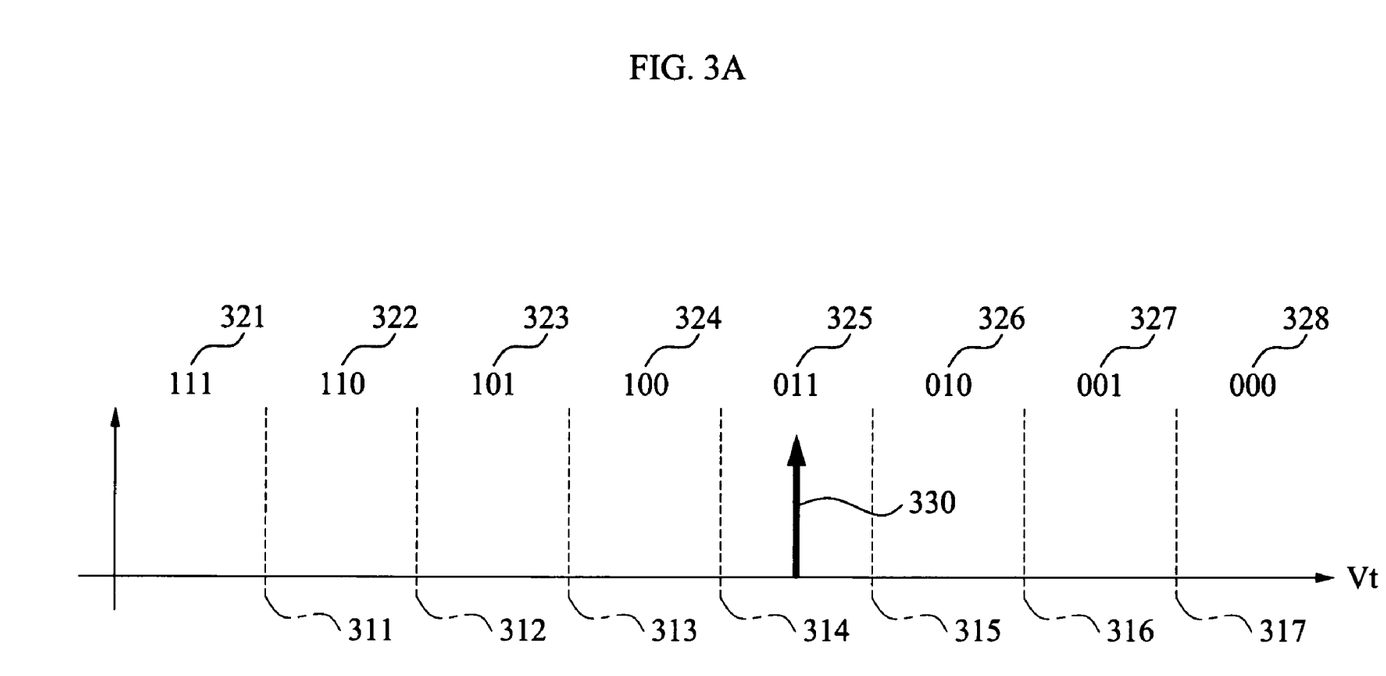
FIGS. 3A through 3C illustrate a method of controlling a reference voltage and simultaneously eliminating an error occurring in an upper bit of two-bit data, according to example embodiments, when the error occurs in an upper bit of two-bit data among a plurality of data bits stored in a memory cell.
Figure 3B:
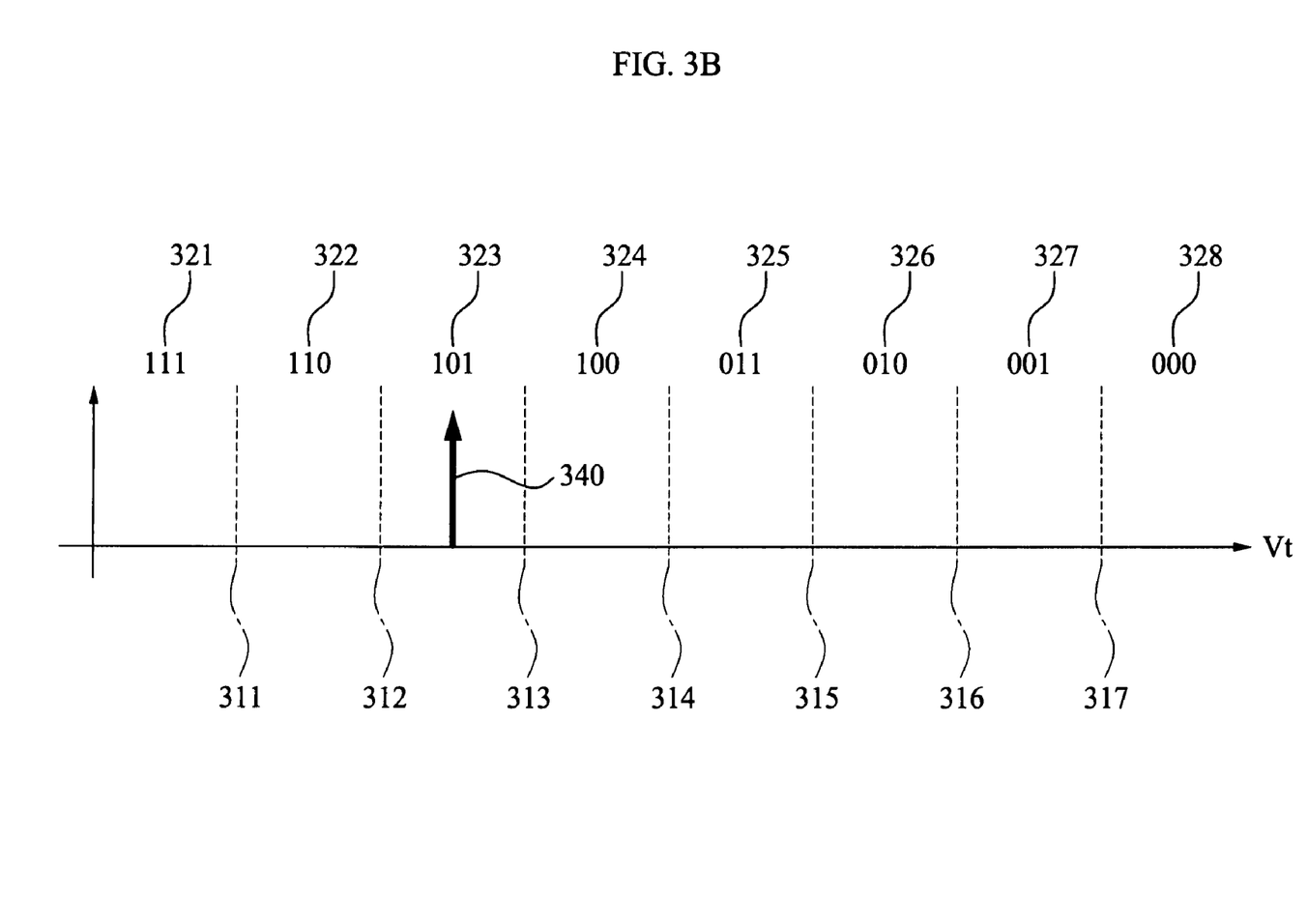
Figure 3C:
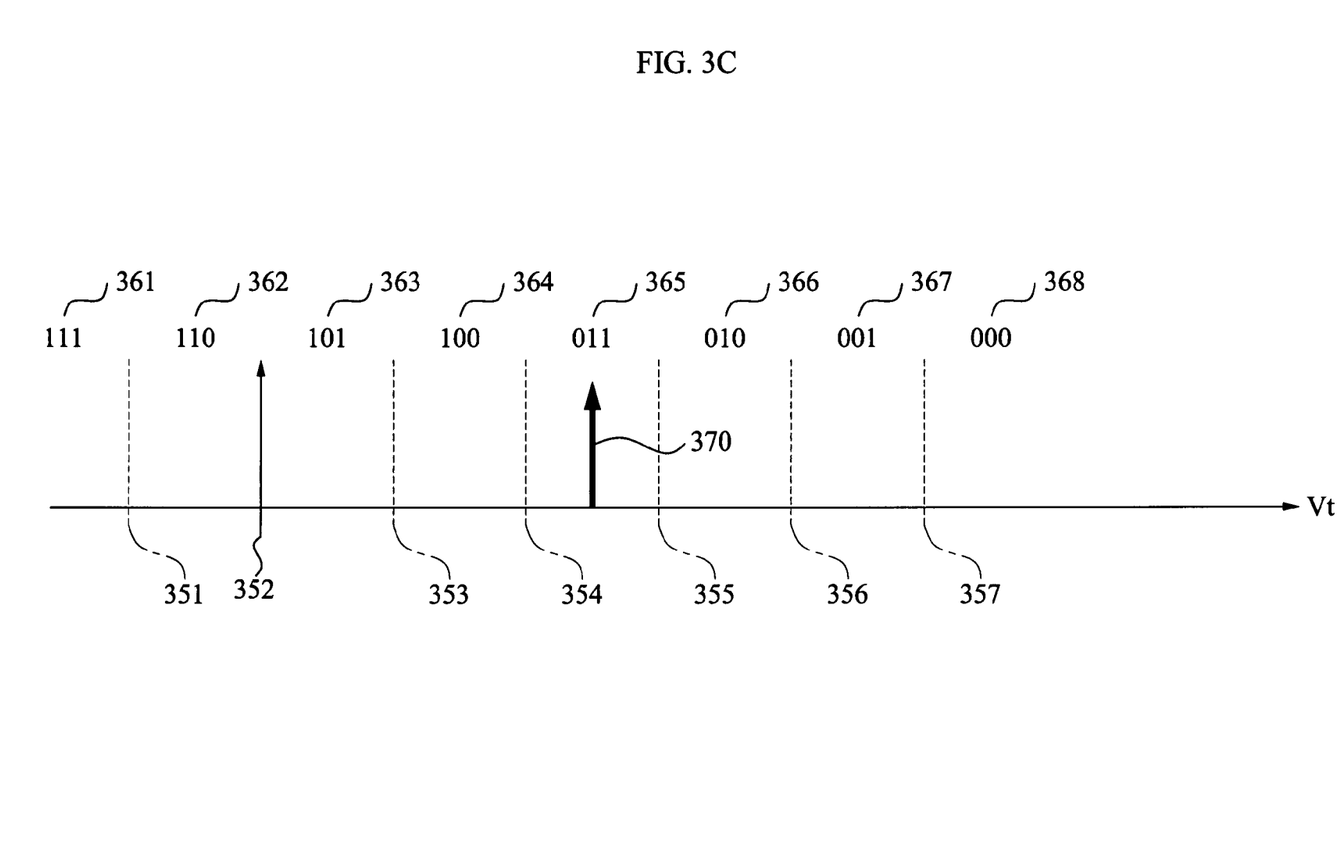

FIGS. 3A through 3C illustrate a method of controlling a reference voltage and simultaneously eliminating an error occurring in an upper bit of two-bit data, according to example embodiments, when the error occurs in an upper bit of two-bit data among a plurality of data bits stored in a memory cell.

FIG. 3A illustrates a threshold voltage of the memory cell of when data is stored in the memory cell. The example embodiment of FIGS. 3A through 3C illustrate that three-bit data is stored in the memory cell. A range of values that the threshold voltage of the memory cell may have is divided into a plurality of regions 321, 322, 323, 324, 325, 326, 327, and 328 by a plurality of first voltages 311, 312, 313, 314, 315, 316, and 317. Example embodiments of FIGS. 3A through 3C further illustrate that data having a value "011" is stored in the memory cell. To store data having a value "011," a threshold voltage 330 of the memory cell may be required to be located in a fifth region 325.

FIG. 3B illustrates that the threshold voltage of the memory cell may be changed based on several reasons.

According to example embodiments, the threshold voltage 330 located in the fifth region 325 may be moved to a third region 323. A memory data detecting apparatus according to example embodiments may compare the threshold voltage 340 of the memory cell with the plurality of the first reference voltages 311, 312, 313, 314, 315, 316, and 317, shown in FIG. 3A, and determine a value of data stored in the memory cell. According to example embodiments, when the threshold voltage 340 is moved to the third region 323, the memory data detecting apparatus may determine the value of the data stored in the memory cell to be "101."

FIG. 3C illustrates a method of determining a second reference voltage based on the error and re-determining the stored data in the memory cell based on the determined second reference voltage, when an error occurs in the stored data. A range of values that the threshold voltage of the memory cell may have is divided into a plurality of regions 361, 362, 363, 364, 365, 366, 367, and 368 by a plurality of second reference voltages 351, 352, 353, 354, 355, 356, and 357.

According to example embodiments, it is possible that the second reference voltage may be sequentially updated from a lower bit to an upper bit data from among a plurality of data bits stored in the memory cell depending on whether an error occurs.

In FIG. 3B, an error may occur where the stored data is "011" in the memory cell, and the memory data detecting apparatus detects the data as "101." The error would not be in the least significant bit of the initial data "011," specifically "1." On the contrary, the error would be in the second bit and the most significant bit of the initial data.

According to example embodiments, it is possible that the memory data detecting apparatus may determine the second reference voltage based on the error occurring in the second bit. The memory data detecting apparatus may easily identify that an initial second bit stored in the memory cell is "1." Thus, the memory data detecting apparatus may also identify that the initial data stored in the memory cell is either "011" or "111." The memory data detecting apparatus may verify that the threshold voltage of the memory cell may have been located in either the first region 321 or the fifth region 325.

However, a change of the threshold voltage due to HTS may progress toward a lower threshold voltage. Accordingly, the memory data detecting apparatus may verify that the threshold voltage of the memory cell may have been located in the fifth region 325.

Referring to FIG. 3C, the memory data detecting apparatus may thus determine the second reference voltages 351, 352, 353, 354, 355, 356, and 357 to enable the threshold voltage be located in the fifth region 365. A range of values that the threshold voltage of the memory cell may have based on the determined the second reference voltages is divided into eight regions 361, 362, 363, 364, 365, 366, 367, and 368.

According to example embodiments, the second reference value may be determined to correct the error occurring in the second bit. In this case, a changed threshold voltage 370 may be located in a fifth region 365 among the eight regions.

The memory data detecting apparatus may re-determine the value of at least one data bit based on the newly determined second reference voltage. According to the example embodiment of FIGS. 3A through 3C, the re-determined data value may be detected as "011."

The memory data detecting apparatus may verify whether an error occurs in the re-detected data "011." In example embodiments of FIGS. 3A through 3C, since the re-detected data "011" may have the same as the initial data stored in the memory cell, the memory data detecting apparatus may not detect an error.

In the example embodiment of FIGS. 3A through 3C, an error occurs in the most significant bit and the second bit. According to example embodiments, even when an error occurs in the at least one data bit, the at least one data bit may be corrected by determining the second reference voltage based on whether an error occurs in the first data bit.

Although the at least one data bit is corrected in the example embodiment of FIGS. 3A through 3C, there may be remaining errors that are not corrected in other example embodiments. For example, when an initial data is "001," the threshold voltage of the memory cell may be located in a seventh region 327. The threshold voltage of the memory cell may be changed to the first region 321 due to HTS. In this case, a detected data by the memory data detecting apparatus based on the first reference voltage may be "111." The memory data detecting apparatus may identify that an error occurs in the second bit in the detected data.

According to example embodiments, the memory data detecting apparatus may determine the second reference voltage to eliminate the error in the second bit. As the threshold voltage becomes lower due to HTS, it may be verified that the threshold voltage of the memory cell at the time of storing data may have been located in either the third region 323 or the seventh region 327.

According to example embodiments, the memory data detecting apparatus may determine the second reference voltage to reduce a difference between the first reference voltage and the second reference voltage. When the difference between the first reference voltage and the second reference voltage is reduced, a distance moved between each region may be relatively short, with each region including the region being divided based on the first reference voltages and the region being divided based on the second reference voltages. Thus, the memory data detecting apparatus may verify that a threshold voltage at the time of storing data may have been located in a third region that is relatively near to a first region in which a threshold voltage at the time of detecting the data is located.

When it is verified that the threshold voltage at the time of storing the data is located in the third region, the memory data detecting apparatus may determine the second reference voltage to enable the threshold voltage at the time of detecting the data to be located in the third region among the regions divided by the second reference voltages.

The memory data detecting apparatus may re-determine the value of the at least one data bit stored in the memory cell based on the second reference voltage.

The memory data detecting apparatus may compare the threshold voltage of the memory cell and the second reference voltage and identify that the threshold voltage of the memory cell is located in the third region. When the threshold voltage of the memory cell is located in the third region, the data stored in the memory cell may be "101." The memory data detecting apparatus may verify whether an error occurs in the re-determine data. Because the initial data stored in the memory cell is "001," the memory data detecting apparatus may identify that an error occurs in the most significant bit of the re-determine data.

According to example embodiments, the memory data detecting apparatus may update the second reference voltage according to whether an error occurs in an upper bit of the error-corrected data.

The memory data detecting apparatus may update the second reference voltage based on an error occurring in the most significant bit. When the threshold voltage of the memory cell becomes lower, the threshold voltage at the time of storing data may be verified to be higher than the threshold voltage of the memory cell at the time of detecting the data. According to example embodiments, the memory data detecting apparatus may identify that the threshold voltage at the time of storing the data in the memory cell is located in the seventh region, and not the third region.

The memory data detecting apparatus may update the second reference voltage to enable the threshold voltage to be located in the seventh region.

Although three-bit data is shown to be stored in the memory cell in examples embodiments of FIGS. 3A through 3C, two-bit data or four or more-bit data may also be stored in the memory cell in example embodiments. Even when two-bit data or the four or more-bit data is stored in the memory cell, the memory data detecting apparatus may update the second reference voltage based on an error in the data in the same manner as example embodiments where three-bit data was stored. The memory data detecting apparatus may re-determine the value of data stored in the memory cell based on the updated second reference voltage.

Figure 4:
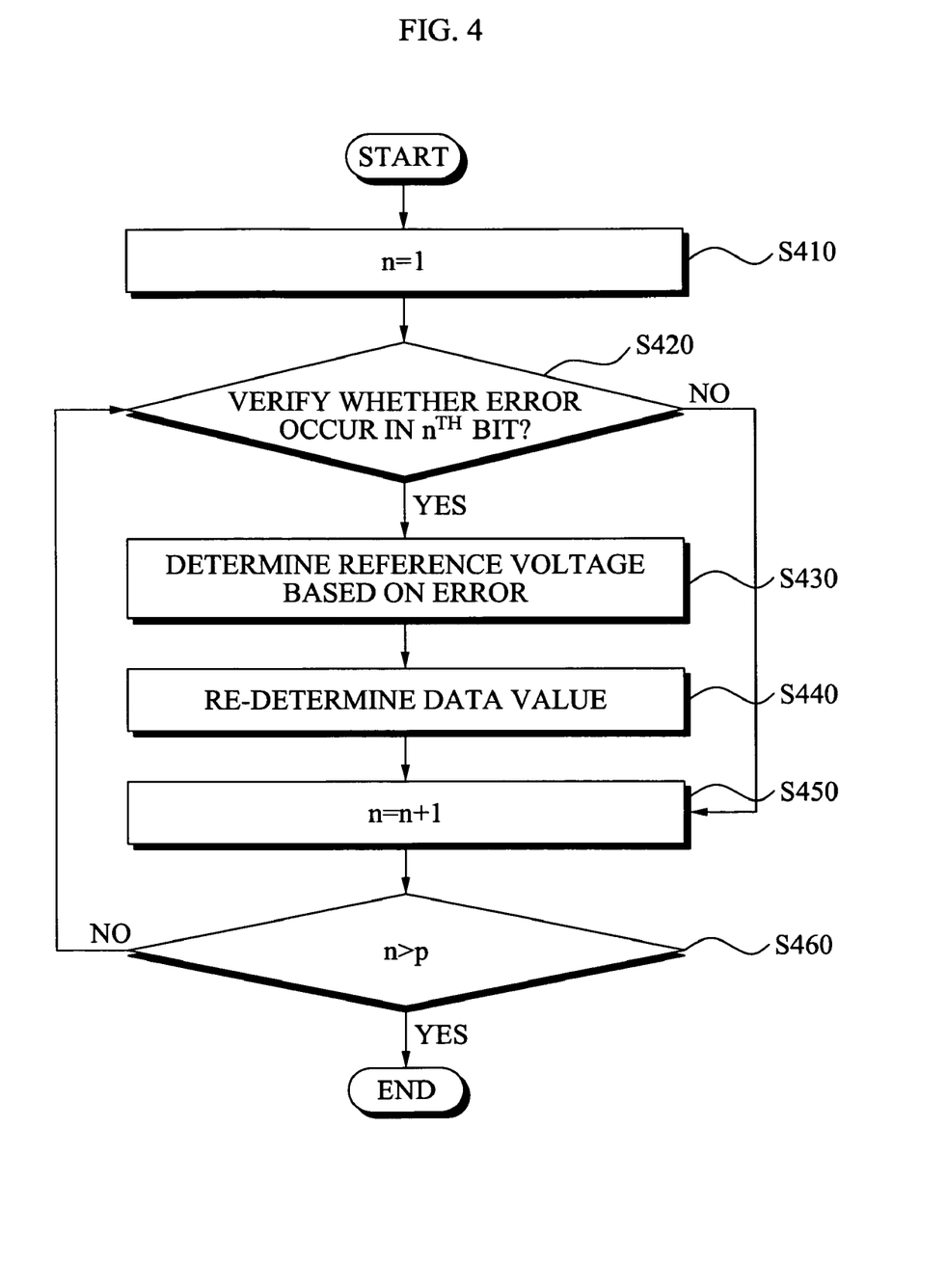
FIG. 4 is a flowchart illustrating sequentially updating a second reference voltage from a lower bit to upper bit according to whether an error occurs in data according to example embodiments.

FIG. 4 is a flowchart illustrating example embodiments of sequentially updating a second reference voltage from a lower bit to an upper bit according to whether an error occurs in the data. A method for sequentially updating the second reference voltage according to example embodiments is described below with reference to FIG. 4.

According to example embodiments, when at least one data bit is stored in a memory cell, the second reference voltage may be sequentially updated from the lower bit to the upper bit according to whether an error occurs in data.

In operation S410, a bit index n may be initialized, where the bit index indicates a data bit that is corrected by a memory data detecting apparatus among the at least one data bit. According to example embodiments, the at least one data bit may be sequentially corrected from the least significant bit to the most significant bit. In this case, the bit index n may be initialized to be "1" and the data may be corrected from the least significant bit.

In operation S420, whether an error occurs in a bit that is indicated by the bit index n among the at least one data bit stored in the memory cell is verified. According to example embodiments, identical data among the at least one data bit stored in at least one memory cell may be error correcting coded together. In this instance, all of the error correcting coded bits may be decoded together, and the memory data detecting apparatus may verify whether an error occurs in a specific data bit among the data stored in the memory cell.

When an error does not occur in the bit that the bit index n indicates in operation S420, a value of n may be increased in operation S450.

When an error occurs in the bit that the bit index n indicates in operation S430, the second reference voltage may be determined based on the error of an $n^{th}$ data bit in operation S440.

In operation S430, for determining the second reference voltage, the second reference voltage may be determined to eliminate an error in the $n^{th}$ bit.

In operation S440, the value of the at least one data bit may be re-determined according to the second reference voltage determined in operation S430 based on the second reference voltage. It may be possible to re-determine all the values of the at least one data bit stored in the memory cell as well as the value of the $n^{th}$ bit when the error occurs.

According to example embodiments, the second reference voltage may be updated according to whether an error occurs in upper bit data of the $n^{th}$ error-bit among the data re-determined in operation S440.

In operation S450, the value of bit index n may be increased. The bit index n may indicate an upper bit of an error-bit where an error occurs, not the corrected error-bit.

In operation S460, the increased bit index n may be compared with p, which may be the length of the at least one data bit stored in the memory cell. When the bit index n is greater than p, memory data detecting procedure of the example embodiment may end, because all the errors with respect to the at least one data bit may be completed.

When the bit index n is less than or equal to p, it may be required to verify whether an error occurs in the $n^{th}$ data again in operation S420, since all the errors with respect to the at least one data bit may not have been completed.

According to example embodiments, even when at least one data bit is stored in the memory cell, whether an error respectively occurs in each bit in the same manner is verified, and the second reference voltage may be updated based on the error. Also, a method of updating the second reference voltage may not be changed based on a location of each data, but the second reference voltage may be updated using the same method. Thus, the above method may be implemented with hardware.

Figure 5:
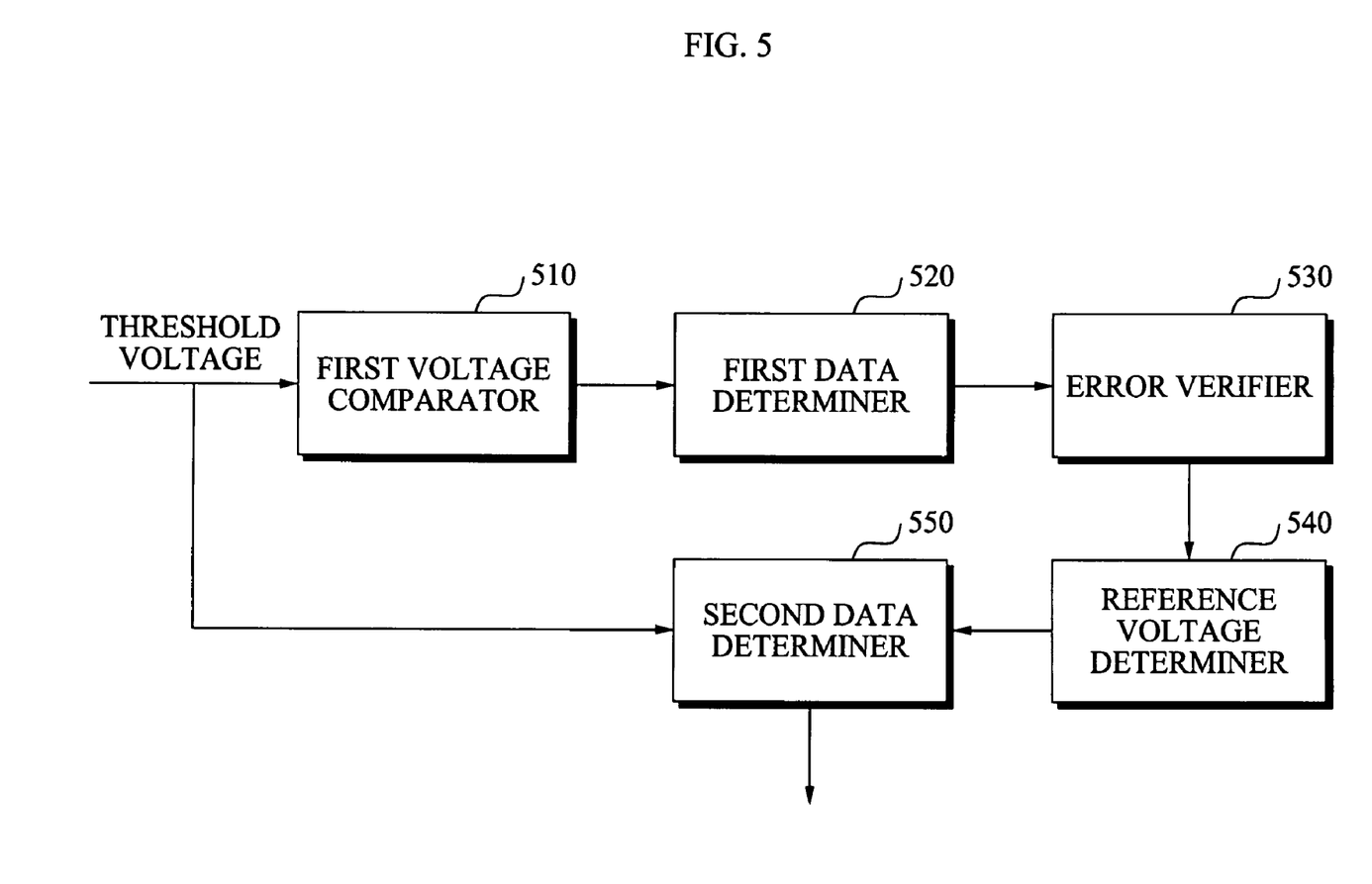
FIG. 5 is a block diagram illustrating a structure of a memory data detecting apparatus according to example embodiments.

FIG. 5 is a block diagram illustrating a structure of a memory data detecting apparatus according to example embodiments. The memory data detecting apparatus may be described in detail below with reference to FIG. 5. According to example embodiments, the memory data detecting apparatus 500 may include a first voltage comparator 510, a first data determiner 520, an error verifier 530, a reference voltage determiner 540, and a second data determiner 550.

The first voltage comparator 510 may compare a threshold voltage with a first reference voltage. A range of values that the threshold voltage of a memory cell may have is divided into a plurality of regions by the first reference voltages.

The first data determiner 520 may determine a value of at least one data bit stored in the memory cell according to the comparison result between the threshold voltage of the memory cell and the first reference voltage. The first data determiner 520 may identify a region where the threshold voltage of the memory cell is located in based on the comparison result between the threshold voltage of the memory cell and the first reference voltage. The value of the at least one data bit stored in the memory cell may be determined based on the region where the threshold voltage of the memory cell is located.

In general, when N-bits are stored in the memory cell, a range of the threshold voltage of the memory cell may be divided into $2^N$ regions by $2^N-1$ first reference voltages. The memory data detecting apparatus may determine value of N-bit data based on an ordinal number of a region where the threshold voltage of the memory cell is located in among the $2^N$ regions.

The error verifier 530 may verify whether an error occurs in the data determined in the first data determiner 520. According to example embodiments, the at least one data bit stored in the same memory may be error correcting coded together. In this case, the error verifier 530 may verify whether an error occurs in the at least one data bit stored in the same memory cell.

According to example embodiments, same-bit data among at least one data bit stored in a different memory cell may be error-correction encoded. A first data bit in a first memory cell and a first data bit of a second memory cell may be error-correction encoded together. In this case, a memory data detecting apparatus may verify whether an error occurs in at least one data bit stored in the same bit of a different memory cell.

According to example embodiments, the error verifier 530 may verify whether an error occurs in the determined data using either a block code or a conventional code.

The reference voltage determiner 540 may determine a second reference voltage that has a lower voltage than the first reference voltage based on an error in the data stored in the memory cell.

The threshold voltage of the memory cell may change due to HTS. Generally, the threshold voltage changes toward a lower threshold voltage. An error may occur in data of the memory cell detected by comparing the threshold voltage of the memory cell with the first reference voltage, but an error may not occur in data of the memory cell detected by comparing the threshold voltage of the memory cell with the second reference voltage.

The reference voltage determiner 540 may identify a location of an error-bit among the at least one data bit stored in the memory cell and determine the second reference voltage according to the identified location of the error-bit.

When either HTS does not have a significant effect on the threshold voltage or a sufficient amount of time has not passed after storing data in the memory cell, the threshold voltage of the memory cell may not change a great amount. In this case, there may be a more likely possibility that the threshold voltage of the memory cell is located in a region closer to a region at the time of storing data in the memory cell. Thus, the reference voltage determiner 540 may determine the second reference voltage to reduce a difference between the first reference voltage and the second reference voltage.

According to example embodiments, the reference voltage determiner 540 may determine the second reference voltage to eliminate an error from error-bit data in the at least one data bit.

When at least one data bit is stored in the memory cell, the reference voltage determiner 540 may determine the second reference voltage based on an error in a specific data bit among the data stored in the memory cell, and may re-determine a value of all the data stored in the memory cell based on the determined second reference voltage. The reference voltage determiner 540 may update the second reference voltage according to whether an error occurs in upper bit data of the specific error-bit data among the re-determined data.

The second data determiner 550 may re-determine value of the data stored in the memory cell based on the second reference voltage determined by the reference voltage determiner 540. Since the second reference voltage may be determined according to whether an error occurs in the data stored in the memory cell, the value of the data determined by the second data determiner 550 may be accurate even when there is an error existing in the data is stored in the memory cell.

A method for controlling a reference voltage based on whether an error occurs in the stored data may be recorded in computer-readable media including program instructions to implement various operations embodied by a computer.

The media may also include, alone or in combination with the program instructions, data files, data structures, and the like. The program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. When all of or a part of the memory data detecting method described in the example embodiments is implemented with a computer program, the computer-readable media storing the computer program may be included in example embodiments.

Although example embodiments have been shown and described, example embodiments are not limited to those described herein. Instead, it would be appreciated by those skilled in the art that changes may be made to example embodiments without departing from the principles and spirit of example embodiments, the scope of which is defined by the claims and their equivalents.

What is claimed is:

1. A method for detecting memory data, comprising:
comparing a threshold voltage of a memory cell with a first reference voltage;
determining a value of at least one data bit stored in the memory cell according to the comparing;
verifying whether an error occurs in the at least one data bit based on the determining a value;
determining a second reference voltage that is lower than the first reference voltage based on the verifying; and re-determining the value of the at least one data bit based on the determining the second reference voltage, wherein the determining of the second reference voltage includes identifying an error-bit location where an error occurs among the data bits and determining the second reference voltage according to the identified error-bit location.

2. The method of claim 1, wherein the determining of the second reference voltage further includes, determining the second reference voltage so that a difference between the first and the second reference voltage is reduced.

3. The method of claim 2, wherein the determining of the second reference voltage further includes, determining the second reference voltage so that an error is eliminated from error-bit data in the at least one data bit.

4. The method of claim 1, wherein the determining of the second reference voltage includes, determining the second reference voltage so that a difference between the first and the second reference voltage is reduced.

5. The method of claim 1, wherein the determining of the second reference voltage includes, determining the second reference voltage so that an error is eliminated from error-bit data in the at least one data bit.

6. The method of claim 1, wherein the determining of the second reference voltage includes, determining the second reference voltage based on an error of a lower bit of the at least one data bit;

re-determining the value of the at least one data bit based on the determining the second reference voltage; and updating the second reference voltage according to whether an error occurs in an upper data bit of the at least one data bit among the re-determined data.

7. The method of claim 1, wherein the verifying of whether an error occurs includes, verifying whether an error occurs in the determined data using at least one of a block code and a convolutional code.

8. A non-transitory computer readable medium storing a computer program for implementing the method of claim 1.

9. An apparatus for detecting memory data, comprising:

a first voltage comparator to compare a threshold voltage of a memory cell with a first reference voltage;

a first data determiner to determine a value of at least one data bit stored in the memory cell according to a result of the comparator;

an error verifier to verify whether an error occurs in the determined value;

a reference voltage determiner to determine a second reference voltage that is lower than the first reference voltage based on a result of the verifier; and a second data determiner to re-determine the value of the data based on the determined second reference voltage, wherein the reference voltage determiner identifies an error-bit location where an error occurs among the data bits and determines the second reference voltage according to the identified error-bit location.

10. The apparatus of claim 9, wherein the reference voltage determiner determines the second reference voltage so that a difference between the first and the second reference voltage is reduced.

11. The apparatus of claim 10, wherein the reference voltage determiner determines the second reference voltage to eliminate an error from error-bit data in the at least one data bit.

12. The apparatus of claim 9, wherein the reference voltage determiner determines the second reference voltage so that a difference between the first and the second reference voltage is reduced.

13. The apparatus of claim 9, wherein the reference voltage determiner determines the second reference voltage to eliminate an error from error-bit data in the at least one data bit.

14. The apparatus of claim 9, wherein, the reference voltage determiner determines the second reference voltage based on an error of a lower data bit of the at least one data bit, re-determines the value of the at least one data bit based on the determined second reference voltage, and updates the second reference voltage according to whether an error occurs in an upper data bit of the at least one data bit among the re-determined data.

15. The apparatus of claim 9, wherein the error verifier verifies whether an error occurs in the determined data using at least one of a block code and a convolutional code.

* * * * *